United States Patent
Dangelmaier et al.

(10) Patent No.: US 11,073,572 B2
(45) Date of Patent: Jul. 27, 2021

(54) CURRENT SENSOR DEVICE WITH A ROUTABLE MOLDED LEAD FRAME

(71) Applicant: Infineon Technologies AG, Neubiberg (DE)

(72) Inventors: Jochen Dangelmaier, Beratzhausen (DE); Rainer Markus Schaller, Saal a.d. Donau (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 16/250,747

(22) Filed: Jan. 17, 2019

(65) Prior Publication Data

US 2020/0233044 A1    Jul. 23, 2020

(51) Int. Cl.
*H01L 23/495* (2006.01)
*G01R 33/00* (2006.01)
*G01R 33/07* (2006.01)
*H01L 23/31* (2006.01)
*H01L 23/00* (2006.01)

(52) U.S. Cl.
CPC ....... *G01R 33/0047* (2013.01); *G01R 33/072* (2013.01); *H01L 23/3114* (2013.01); *H01L 23/49541* (2013.01); *H01L 24/48* (2013.01); *H01L 2224/4809* (2013.01)

(58) Field of Classification Search
CPC .......... H01L 23/3114; H01L 23/49541; H01L 24/48; G01R 33/0047; G01R 33/072
See application file for complete search history.

(56) References Cited

U.S. PATENT DOCUMENTS

| | | | |
|---|---|---|---|
| 7,608,482 B1* | 10/2009 | Bayan | H01L 24/97 257/666 |
| 8,841,758 B2* | 9/2014 | Daniels | H01L 23/49558 257/676 |
| 9,000,761 B2 | 4/2015 | Tay et al. | |
| 9,658,296 B2 | 5/2017 | Ausserlechner et al. | |
| 9,728,493 B2 | 8/2017 | Strutz et al. | |
| 9,741,677 B1 | 8/2017 | Strutz et al. | |
| 10,079,198 B1* | 9/2018 | Cadag | H01L 21/4853 |
| 10,199,312 B1* | 2/2019 | Rivera-Marty | H01L 24/81 |
| 2005/0001219 A1 | 1/2005 | Minamio | H01L 31/0203 257/79 |
| 2009/0001532 A1* | 1/2009 | Shiomi | H01L 24/40 257/675 |
| 2009/0246912 A1* | 10/2009 | Ueda | H01L 21/561 438/113 |
| 2011/0039371 A1* | 2/2011 | Sirinorakul | H01L 24/97 438/112 |

(Continued)

*Primary Examiner* — Nathan W Ha
(74) *Attorney, Agent, or Firm* — Harrity & Harrity, LLP (57) ABSTRACT

A current sensor device may include a routable molded lead frame that includes a molded substrate. The current sensor device may include a conductor and a semiconductor chip mounted to the molded substrate. The semiconductor chip may include a magnetic field sensor that is galvanically isolated from the conductor by the molded substrate and is configured to sense a magnetic field created by current flowing through the conductor. The current sensor device may include one or more leads configured to output a signal generated by the semiconductor chip. The one or more leads may be galvanically isolated from the conductor by the molded substrate.

20 Claims, 5 Drawing Sheets

(56) References Cited

U.S. PATENT DOCUMENTS

| | | | | |
|---|---|---|---|---|
| 2012/0234592 A1* | 9/2012 | Takagi | ................... | H01L 23/66 |
| | | | | 174/266 |
| 2013/0256852 A1* | 10/2013 | Wyant | ..................... | H01L 24/84 |
| | | | | 257/670 |
| 2014/0367739 A1* | 12/2014 | Muto | ................. | H01L 29/7397 |
| | | | | 257/146 |
| 2016/0013382 A1* | 1/2016 | Ozeki | .................... | H01L 33/60 |
| | | | | 257/98 |
| 2016/0020051 A1* | 1/2016 | Ma | ........................ | H01Q 5/314 |
| | | | | 343/750 |
| 2016/0104688 A1* | 4/2016 | Cho | .................... | H01L 23/3114 |
| | | | | 257/76 |
| 2016/0308104 A1* | 10/2016 | Sasaoka | ................ | H01L 25/13 |
| 2017/0117210 A1* | 4/2017 | Hayashi | ........... | H01L 23/49565 |
| 2017/0125325 A1* | 5/2017 | Shibuya | ............ | H01L 23/49551 |
| 2017/0338168 A1* | 11/2017 | Park | ...................... | H01L 23/051 |
| 2018/0138134 A1* | 5/2018 | Chikamatsu | ........ | H01L 21/4842 |
| 2018/0190573 A1* | 7/2018 | Mullenix | ................ | H01F 17/04 |
| 2019/0194453 A1* | 6/2019 | Liu | ........................ | H01L 24/73 |
| 2019/0386206 A1* | 12/2019 | Schaller | ................ | H01L 21/565 |
| 2020/0135632 A1* | 4/2020 | Mishra | ............. | H01L 23/49861 |

* cited by examiner

CURRENT SENSOR DEVICE WITH A ROUTABLE MOLDED LEAD FRAME

BACKGROUND

A current sensor may be used to detect electric current in a wire or other conductor, and may generate a signal proportional to the detected current. Such information can be used in a variety of applications, and sensed current parameters can be used to control electronic systems.

SUMMARY

According to some possible implementations, a current sensor device may include a routable molded lead frame that includes a molded substrate. The current sensor device may include a conductor and a semiconductor chip mounted to the molded substrate. The semiconductor chip may include a magnetic field sensor that is galvanically isolated from the conductor by the molded substrate and is configured to sense a magnetic field created by current flowing through the conductor. The current sensor device may include one or more leads configured to output a signal generated by the semiconductor chip. The one or more leads may be galvanically isolated from the conductor by the molded substrate.

According to some possible implementations, a semiconductor device package may include a base plate comprised of a lead frame that includes a molded substrate. The semiconductor device package may include a conductor positioned adjacent to the molded substrate. The semiconductor device package may include a current sensor positioned on the molded substrate. The molded substrate may galvanically isolate the current sensor from the conductor. The semiconductor device package may include one or more leads adjacent to the molded substrate and configured to output a signal generated by the current sensor due to measurement of a magnetic field generated by current flowing through the conductor.

According to some possible implementations, a method for fabricating a semiconductor device may include etching a conductive material and introducing a pourable material, into space formed by etching the conductive material, to form a molded substrate. The method may include disposing a semiconductor chip, that includes a magnetic field sensor, onto the molded substrate such that the molded substrate galvanically isolates the magnetic field sensor from the conductive material.

DETAILED DESCRIPTION

The following detailed description of example implementations refers to the accompanying drawings. The same reference numbers in different drawings may identify the same or similar elements.

A current sensor may include a magnetic field sensor that senses a magnetic field generated by current flowing through a conductor, such as a current rail internal to a device package that includes the current sensor or external from the device package. Such a magnetic current sensor does not require contact with the conductor to measure the current (unlike a shunt resistor current sensor), which can be used to improve galvanic isolation between high voltage components (e.g., application voltage) and low voltage components (e.g., supply voltage, ground voltage, and/or the like). For example, galvanic isolation may be improved between a high voltage component that carries the current to be measured (e.g., the conductor, current rail, and/or the like) and a low voltage component that senses the current (e.g., the magnetic current sensor) and/or a low voltage component that outputs a signal generated based on the sensed current (e.g., a sensor pin, an interconnect, a lead, a wire bond, and/or the like). Some techniques described herein improve galvanic isolation between components of a current sensor device, thereby improving measurement accuracy by reduction or elimination of stray currents. Furthermore, some techniques and apparatuses described herein permit flexible design of current sensors, reduce production costs, improve measurement accuracy, and/or the like.

Figure 1:
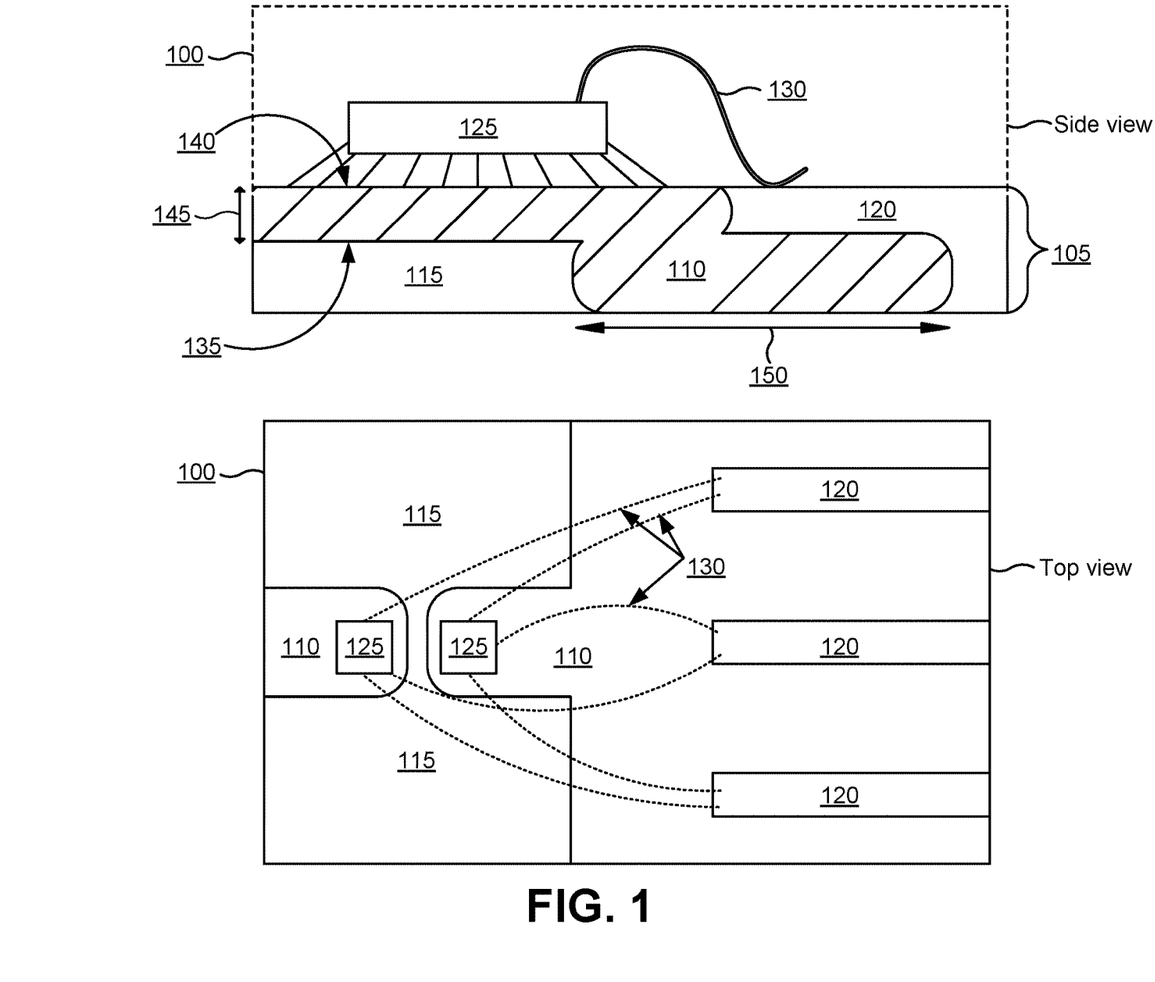
FIGS. 1-3 are diagrams of example current sensor devices described herein.

FIG. 1 is a diagram of a side view and top view of an example current sensor device 100. As shown in FIG. 1, the current sensor device 100 includes a lead frame 105. The lead frame 105 may include a molded substrate 110, a conductor 115, and/or a lead 120 (e.g., one or more leads 120). The lead frame 105 may be referred to as a routable molded lead frame that uses a molded substrate 110 to galvanically isolate different components (e.g., high voltage components and low voltage components). As shown, the conductor 115 may be adjacent to (e.g., adjoining) the molded substrate 110. Similarly, the lead(s) 120 may be adjacent to the molded substrate 110. However, the conductor 115 and the lead(s) 120 may not be adjacent to one another.

The lead frame 105 may be formed by, for example, etching a conductive material (e.g., a metal, such as copper and/or the like) to form the conductor 115 and/or the lead(s) 120 and filling space formed by such etching with a pourable material to form the molded substrate 110 (e.g., when the pourable material hardens). In some implementations, the conductor 115 and the lead(s) 120 may be formed from the same conductive material and/or may consist of the same conductive material. The pourable material may include, for example, a liquid material, a resin, a coreless liquid resin, and/or the like. In some cases, to improve galvanic isolation, the pourable material and/or the molded substrate 110 does not include a conductive material, such as copper and/or the like. For example, the pourable material and/or the molded substrate 110 may consist of a polymer material. The lead frame 105 may be used as a base plate, in a semiconductor device fabrication process, to which one or more components are mounted.

As further shown in FIG. 1, the current sensor device 100 includes a chip 125, such as a semiconductor chip, an integrated circuit, a sensor die, a current sensor, and/or the like. The chip 125 includes one or more magnetic field sensors configured to sense and/or measure a magnetic field (e.g., one or more magnetic field components) generated by a current flowing through the conductor 115. A magnetic filed sensor may include, for example, a sensor integrated circuit, a Hall effect sensor, and/or the like. The chip 125 may generate a signal based on such sensing and/or measurement, and may output the signal to a component external from the current sensor device 100 via one or more leads 120. The signal may be provided to a lead 120 via a connector 130, such as a wire, a bus, a bond, a wire bond, and/or the like. In some implementations, the current sensor device 100 may include multiple chips 125 that output signals to an external device via one or more connectors 130 and/or one or more leads 120.

As shown, the chip 125 may be mounted to the molded substrate 110. For example, the conductor 115 may be positioned on a first side 135 of the molded substrate 110, and the chip 125 may be positioned and/or mounted on a second side 140 of the molded substrate 110 (e.g., opposite the first side 135, as shown). As shown by reference number 145, the molded substrate 110 may galvanically isolate (e.g., electrically insulate) the chip 125 and/or a magnetic field sensor of the chip 125 from the conductor 115. For example, the chip 125 may be a low voltage component (e.g., having a supply voltage potential, connected to ground, and/or the like), and the conductor 115 may be a high voltage component (e.g., having an application power potential). By improving galvanic isolation between the chip 125 (and/or the magnetic field sensor of the chip 125) and the conductor 115, the current sensor device 100 may have improved performance, such as improved measurement accuracy due to reduction of stray currents, improved thermal management, and/or the like.

Similarly, and as shown by reference number 150, the molded substrate 110 may galvanically isolate (e.g., electrically insulate) the lead(s) 120 from the conductor 115. For example, a lead 120 may be a low voltage component, and the conductor 115 may be a high voltage component. By improving galvanic isolation between the lead 120 and the conductor 115, the current sensor device 100 may have improved performance by reducing creeping of ions between the conductor 115 and the lead 120, which may result in improved measurement accuracy due to reduction of stray currents, improved thermal management, and/or the like. By using a routable molded lead frame, a variety of lead frames may be designed with different creeping clearances (e.g., a distance between the conductor 115 and the lead 120), thereby providing more flexible sensor design.

In some implementations, the galvanic isolation described above may be achieved via only the molded substrate 110. In this case, the current sensor device 100 does not include any material, between the chip 125 (and/or a mounting material used to mount the chip 125 to the molded substrate 110) and the conductor 115, other than the molded substrate 110. Similarly, in some cases, the current sensor device 100 does not include any material, between the lead 120 and the conductor 115, other than the molded substrate 110. For example, the current sensor device 100 shown in FIG. 1 does not include an isolation platelet or similar galvanic isolation component, other than the molded substrate 110, between the chip 125 and the conductor 115 and between the lead 120 and the conductor 115. In this way, a smaller distance between the chip 125 and the conductor 115 may be achieved by using only the molded substrate 110 for galvanic isolation (e.g., as compared to using an isolation platelet or other galvanic isolation component or galvanic isolation layer), thereby improving a signal to noise ratio of a magnetic signal measured by the chip 125.

As shown in FIG. 1, in some implementations, the conductor may include a current rail internal to the current sensor device 100 and/or a semiconductor device package that includes the current sensor device 100. In some implementations, the current rail may be external from the current sensor device 100 and/or a semiconductor device package that includes the current sensor device 100, as described in more detail below in connection with FIG. 2.

As indicated above, FIG. 1 is provided as an example. Other examples may differ from what is described with regard to FIG. 1.

Figure 2:
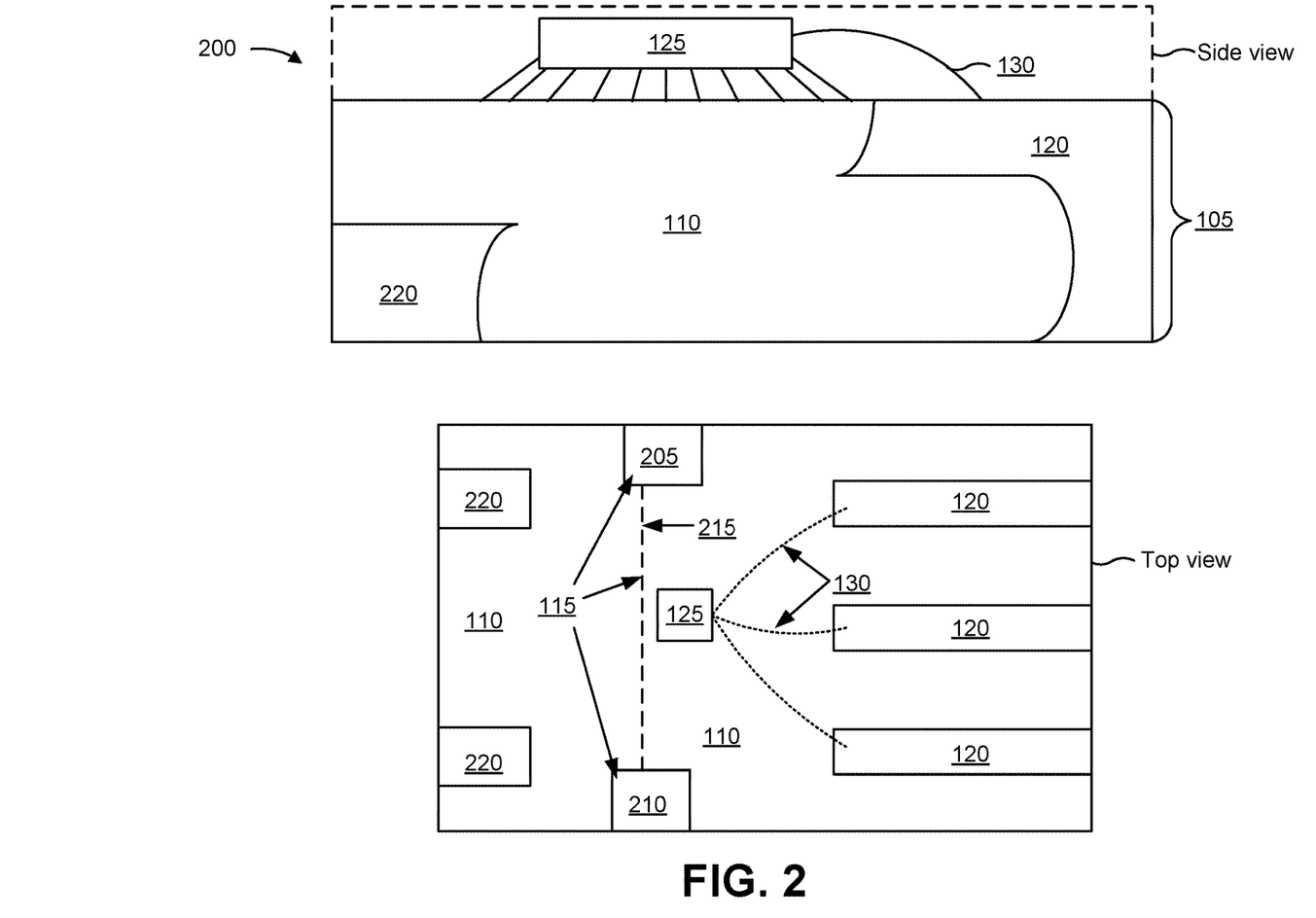

FIG. 2 is a diagram of a side view and top view of an example current sensor device 200. The current sensor device 200 may include one or more components described above in connection with FIG. 1, such as a lead frame 105 (e.g., a routable molded lead frame), a molded substrate 110, a conductor 115, a lead 120, a chip 125, a connector 130, and/or the like.

The current sensor device 200 is an example current sensor device that does not include an internal current rail. For example, the current rail may be external from the current sensor device 200 and/or a semiconductor device package that includes the current sensor device 200. For example, an external current rail may be disposed on a top layer of a printed circuit board (PCB) in proximity to the current sensor device and/or to which the current sensor device is attached. In some implementations, the conductor 115 may include an input connector 205 (e.g., a first connector), an output connector 210 (e.g., a second connector), and/or an internal connector 215 (e.g., a third connector). In some cases, the input connector 205 may electrically connect to the external current rail and/or may input current from the external current rail to the current sensor device 200. Similarly, the output connector 210 may electrically connect to the external current rail and/or may output current from the current sensor device 200 to the external current rail. The internal connector 215 may electrically connect the input connector 205 and the output connector 210 such that current is input via the input connector 205, flows through the internal connector 215, and is output via the output connector 210. Additionally, or alternatively, the external current rail may attach to one or more support structures 220 to provide mechanical support.

Alternatively, the external current rail may not electrically connect to the input connector 205 and/or the output connector 210. Additionally, or alternatively, the external current rail may not connect to the support structures 220. For example, the external current rail may be implemented in a buried layer of a PCB (e.g., not the top layer), and the current sensor device may be capable of measuring a magnetic field generated by current flowing through the external current rail due to a proximity of the current sensor device relative to the external current rail (e.g., the current sensor device may be attached to the PCB). In this case, the support structure(s) 220, the input connector 205, and/or the output connector 210 may provide mechanical support for the current sensor device (e.g., mechanical fixation and/or stability), may assist with realizing a semiconductor device package standoff, and/or the like. Alternatively, in some implementations, the current sensor device may not include one or more of the input connector 205, the output connector 210, and/or the support structure(s) 220.

As shown, the internal connector 215 may carry current past the chip 125 (e.g., within a threshold proximity, such that the chip 125 can measure a magnetic field generated by the current). The chip 125 may measure one or more magnetic field components, and may provide a signal, generated based on such measurement(s), to one or more leads 120, as described elsewhere herein. In some implementations, the molded substrate 110 may galvanically isolate the chip 125 and/or a magnetic field sensor of the chip 125 from the conductor 115, in a similar manner as described above in connection with FIG. 1. For example, the molded substrate 110 may galvanically isolate the chip 125 from the input connector 205, the output connector 210, and/or the internal connector 215. By improving galvanic isolation between the chip 125 (and/or the magnetic field sensor of the chip 125) and the conductor 115, the current sensor device 200 may have improved performance, such as improved measurement accuracy due to reduction of stray currents, improved thermal management, and/or the like.

As further shown in FIG. 2, the lead frame 105 of the current sensor device 200 may include a molded substrate 110, one or more leads 120, one or more support structures 220, and/or the like. A support structure 220 may include a support pin and/or the like. The support structure 220 may provide support for the current sensor device 200, may form the lead frame 105, may assist with mounting the current sensor device 200 to another device and/or structure, may form a structure to be filled with a pourable material to form the molded substrate 110, and/or the like. As shown, the support structure(s) 220, the lead(s) 120, and/or the conductor 115 (e.g., the input connector 205, the output connector 210, and/or the internal connector 215) may be adjacent to the molded substrate 110. However, the support structure(s) 220 and the lead(s) 120 may not be adjacent to one another. Furthermore, the support structure(s) 220 and the conductor 115 may not be adjacent to one another. Furthermore, the lead(s) 120 and the conductor 115 may not be adjacent to one another.

The lead frame 105 may be formed by, for example, etching a conductive material (e.g., a metal, such as copper and/or the like) to form the support structure(s) 220 and/or the lead(s) 120 (and/or the conductor 115) and filling space formed by such etching with a pourable material to form the molded substrate 110 (e.g., when the pourable material hardens). In some implementations, the support structure(s) 220 and the lead(s) 120 may be formed from the same conductive material and/or may consist of the same conductive material.

As indicated above, FIG. 2 is provided as an example. Other examples may differ from what is described with regard to FIG. 2.

Figure 3:
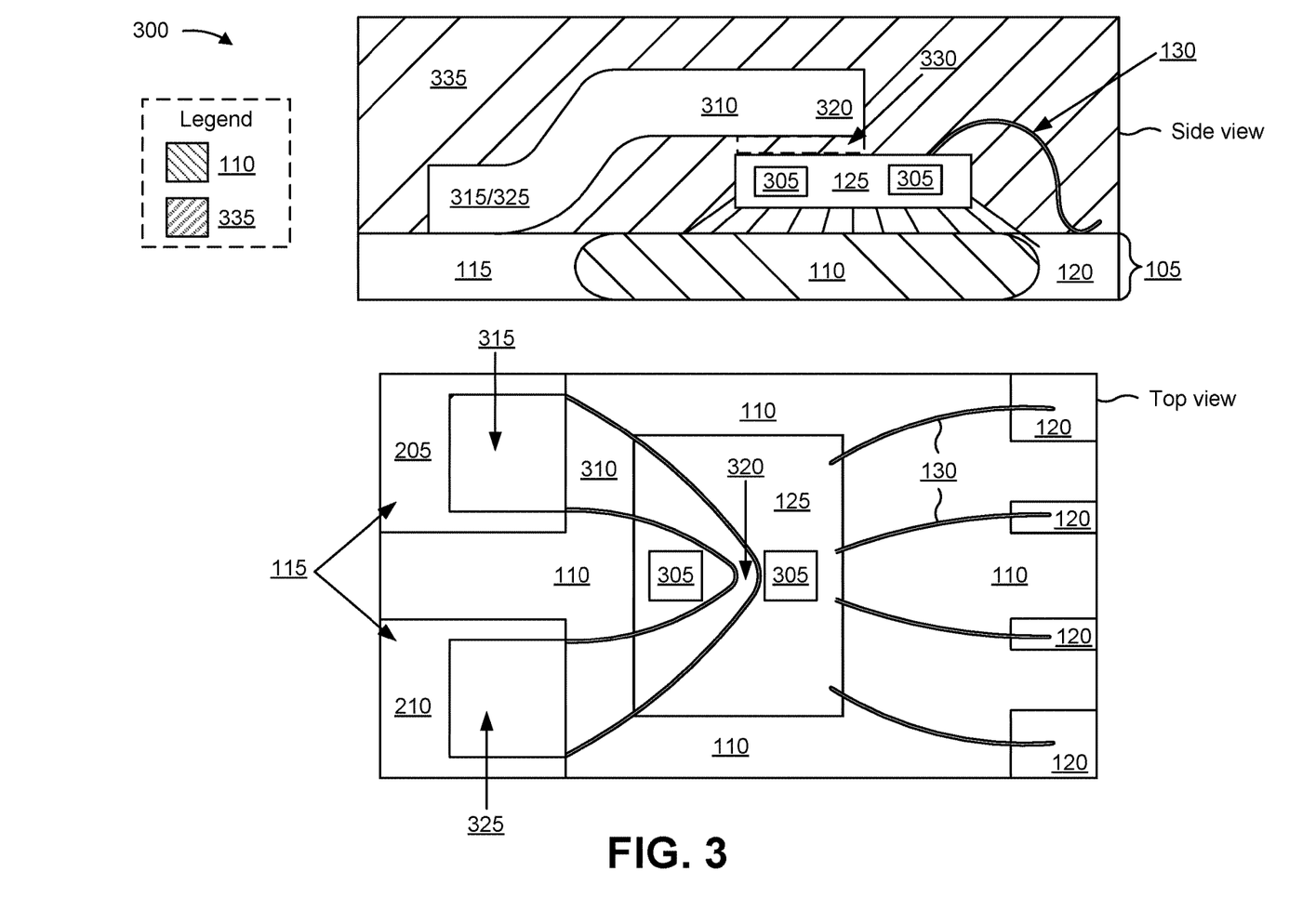

FIG. 3 is a diagram of a side view and top view of an example current sensor device 300. The current sensor device 300 an may include one or more components described above in connection with FIG. 1 and/or FIG. 2, such as a lead frame 105, a molded substrate 110, a conductor 115, a lead 120, a chip 125, a connector 130, and/or the like. As shown in FIG. 3 (and as described elsewhere herein), the chip 125 may include one or more magnetic field sensors 305, such as a sensor integrated circuit, a Hall effect sensor, and/or the like.

As shown in FIG. 3, the current sensor device 300 may include a conductive clip 310. The conductive clip 310 may be composed of a conductive material, such as a metal (e.g., copper) and/or the like. The conductive clip 310 may be electrically connected to the conductor 115 and may be configured to carry current, flowing through the conductor 115, past the chip 125 and/or the magnetic field sensor(s) 305 of the chip 125 (e.g., within a threshold proximity, such that the magnetic field sensor(s) 305 can accurately measure a magnetic field generated by the current). For example, and as shown, the conductive clip 310 may be electrically connected to an input connector 205 and an output connector 210 (e.g., the conductive clip 310 may be the internal connector 215 described above in connection with FIG. 2).

The conductive clip 310 may carry current from a first location 315 farther from the chip 125 to a second location 320 closer to the chip 125, and then to a third location 325 farther from the chip 125. In some implementations, when the conductive clip 310 is not included in the current sensor device, the chip 125 may be mounted above or below the conductor 115 (e.g., as shown in FIG. 1). In some implementations, when the conductive clip 310 is included in the current sensor device, the chip 125 is not mounted above or below the conductor 115. In this case, the conductive clip may carry the current past the chip 125. This allows for greater design flexibility of the current sensor device, and may further improve galvanic isolation.

As further shown in FIG. 3, the conductive clip 310 may be galvanically isolated from the chip 125. For example, the current sensor device 300 may include a standoff region 330 that galvanically isolates the conductive clip 310 from the chip 125. The standoff region 330 may include or may be a region where the conductive clip 310 is in closest proximity to the chip 125. The standoff region 330 may be composed of a molded layer 335. The molded layer 335 may be formed from a pourable material (e.g., after hardening), such as a liquid material, a resin, a coreless liquid resin, and/or the like. In some implementations, the molded layer 335 does not include a conductive material, such as copper and/or the like. For example, the molded layer 335 may consist of a polymer material. In some implementations, the molded substrate 110 and the molded layer 335 may be composed of the same material. In some implementations, the molded substrate 110 and the molded layer 335 may be composed of different materials.

In some implementations, galvanic isolation between the conductive clip 310 and the chip 125 may be achieved via only the molded layer 335. In this case, the current sensor device 300 does not include any material, between the chip 125 and the conductive clip 310, other than the molded layer 335. For example, the current sensor device 300 shown in FIG. 3 does not include an isolation platelet or similar galvanic isolation component, other than the molded layer 335, between the chip 125 and the conductive clip 310. In this way, a smaller distance between the chip 125 and the conductive clip 310 may be achieved by using only the molded layer 335 for galvanic isolation (e.g., as compared to using an isolation platelet or other galvanic isolation component or galvanic isolation layer), thereby improving a signal to noise ratio of a magnetic signal measured by the chip 125.

The current sensor device 300 may be formed by, for example, etching a conductive material (e.g., a metal, such as copper and/or the like) to form the conductor 115, the lead(s) 120, and/or the support structure(s) 220 and filling space formed by such etching with a first pourable material to form the molded substrate 110 (e.g., when the first pourable material hardens). The chip 125 may be disposed onto (e.g., mounted on) the molded substrate 110. The conductive clip 310 may be disposed onto (e.g., mounted on) the conductor 115. A second pourable material may be introduced to form the molded layer 335, including the standoff region 330. In some implementations, the first pourable material and the second pourable material are the same material. In some implementations, the first pourable material and the second pourable material are different materials.

As shown in FIG. 3, in some implementations, the conductive clip 310 may have an arch shape (e.g., a pointed arch shape). As shown, the bases of the arch may connect to the conductor 115, and a crown of the arch may pass near (e.g., above) the chip 125. The conductive clip may have another shape, such as a semi-annular shape, a semi-circle shape, and/or the like. Additional shapes of the conductive clip 310 are shown in FIG. 4.

Using a routable molded lead frame, as described herein, may permit a wide range of thicknesses (e.g., up to 0.5 millimeters in some cases) for the conductive material in the current sensor devices described herein (e.g., for the conductor 115, the lead(s) 120, the support pin(s) 220, and/or the like). For example, the routable molded lead frame may permit a thicker conductive material than using a traditional lead frame, thereby providing improved current capability (e.g., current density) in the current sensor device by reducing ohmic resistance of the conductor 115 (e.g., a current rail). Furthermore, production line processes can be standardized to use a smaller range of thicknesses or fewer thicknesses of conducive material used to produce a variety of sensors, thereby standardizing production processes and reducing production costs.

As indicated above, FIG. 3 is provided as an example. Other examples may differ from what is described with regard to FIG. 3.

Figure 4:
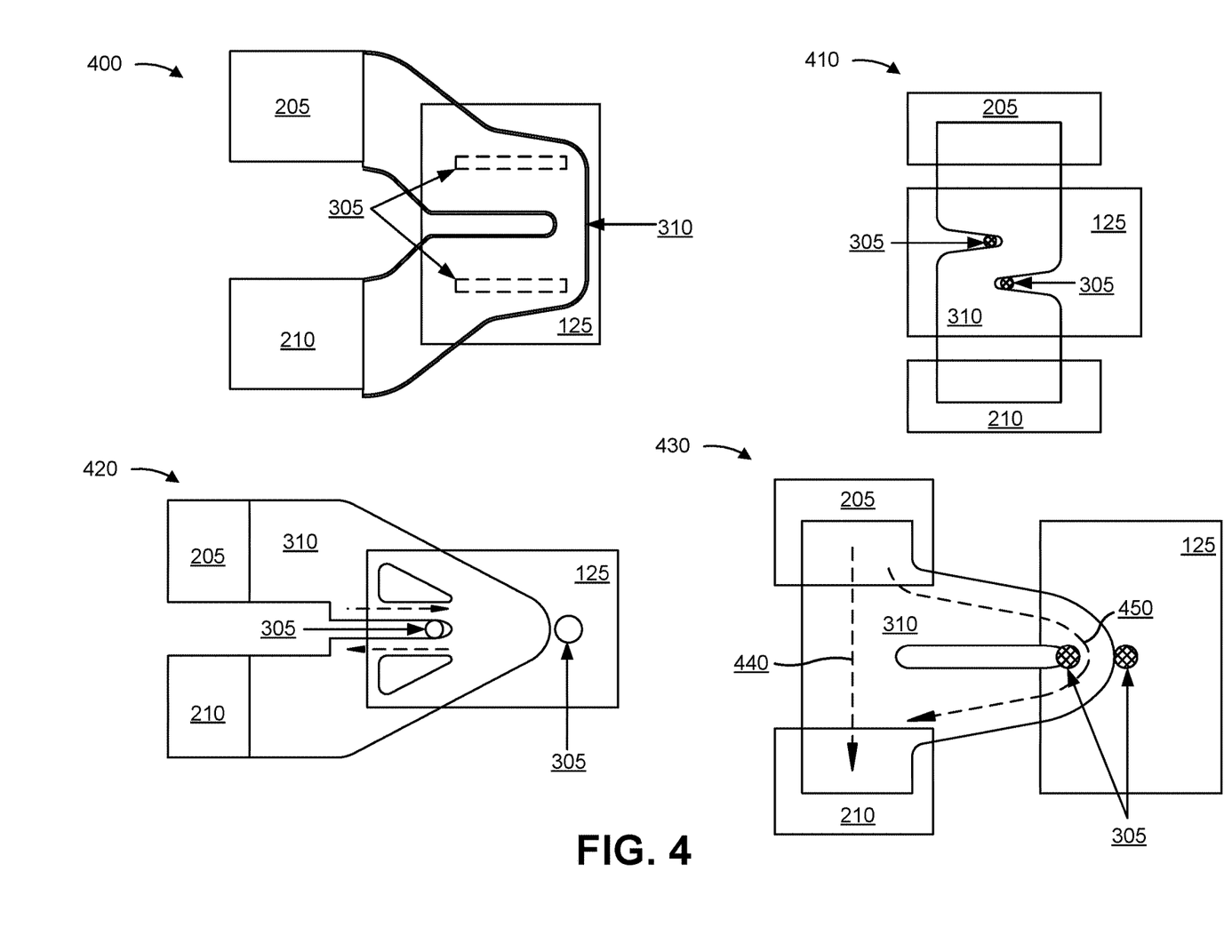
FIG. 4 is a diagram of example conductive clips for a current sensor device.

FIG. 4 is a diagram of example conductive clips 310 for a current sensor device. FIG. 4 shows example top views 400, 410, 420, and 430 of conductive clips 310 having different shapes. The shape of the conductive clip 310 may be designed to control an amount (e.g., a relative amount) of current that flows near the magnetic field sensor(s) 305.

As shown by top view 400, in some implementations, the current sensor device and/or the conductive clip may be designed such that current flows directly above the magnetic field sensor(s) 305. As shown by top views 410, 420, and 430, in some implementations, the current sensor device and/or the conductive clip may be designed such that current does not flow directly above the magnetic field sensor(s) 305.

As shown by top view 410, in some implementations, the magnetic field sensor(s) 305 may be positioned along a direct path from the input connector 205 to the output connector 210. For example, the magnetic field sensor(s) 305 may be positioned between the input connector 205 and the output connector 210 (e.g., when viewed from above). As shown by top views 400, 420, and 430, in some implementations, the magnetic field sensor(s) may not be positioned along a direct path from the input connector 205 to the output connector 210. For example, the magnetic field sensor(s) 305 may not be positioned between the input connector 205 and the output connector 210 (e.g., when viewed from above).

As shown by top view 430, in some implementations, the conductive clip 310 may include a first portion 440 configured to carry current directly from the input connector 205 to the output connector 210, and may include a second portion 450 to carry current past the magnetic field sensor(s) 305. The first portion 440 and the second portion 450 may both carry current from the input connector 205 to the output connector 210, but may carry the current along different paths. For example, the second portion 450 may carry current closer to the magnetic field sensor(s) 305 than the first portion 440. Additionally, or alternatively, the second portion 450 may carry the current within a threshold proximity of the magnetic field sensor(s) 305, and the first portion 440 may not carry current within the threshold proximity. Additionally, or alternatively, the first portion 440 and the second portion 450 may carry different portions of the total current flowing through the conductive clip 310. For example, the first portion 440 may carry 95% of the total current flowing through the conductive clip 310, and the second portion 450 may carry 5% of the total current past the magnetic field sensor(s) 305 (e.g., within a threshold proximity of the magnetic field sensor(s) 305). This may permit flexible design of the conductive clip 310 and/or the current sensor device, and may allow for different types and/or sensitivities of magnetic field sensor(s) 305 to be used.

The conductive clip 310 described herein may provide improved current capability (e.g., current density) in the current sensor by reducing ohmic resistance. Furthermore, because the shape of the conductive clip 310 can be flexibly designed to suit an application of a sensor (e.g., the current sensor device described herein), a standardized base plate and/or lead frame may be used with a variety of different conductive clip designs, thereby standardizing production processes and reducing production costs.

As indicated above, FIG. 4 is provided as an example. Other examples may differ from what is described with regard to FIG. 4.

Figure 5:
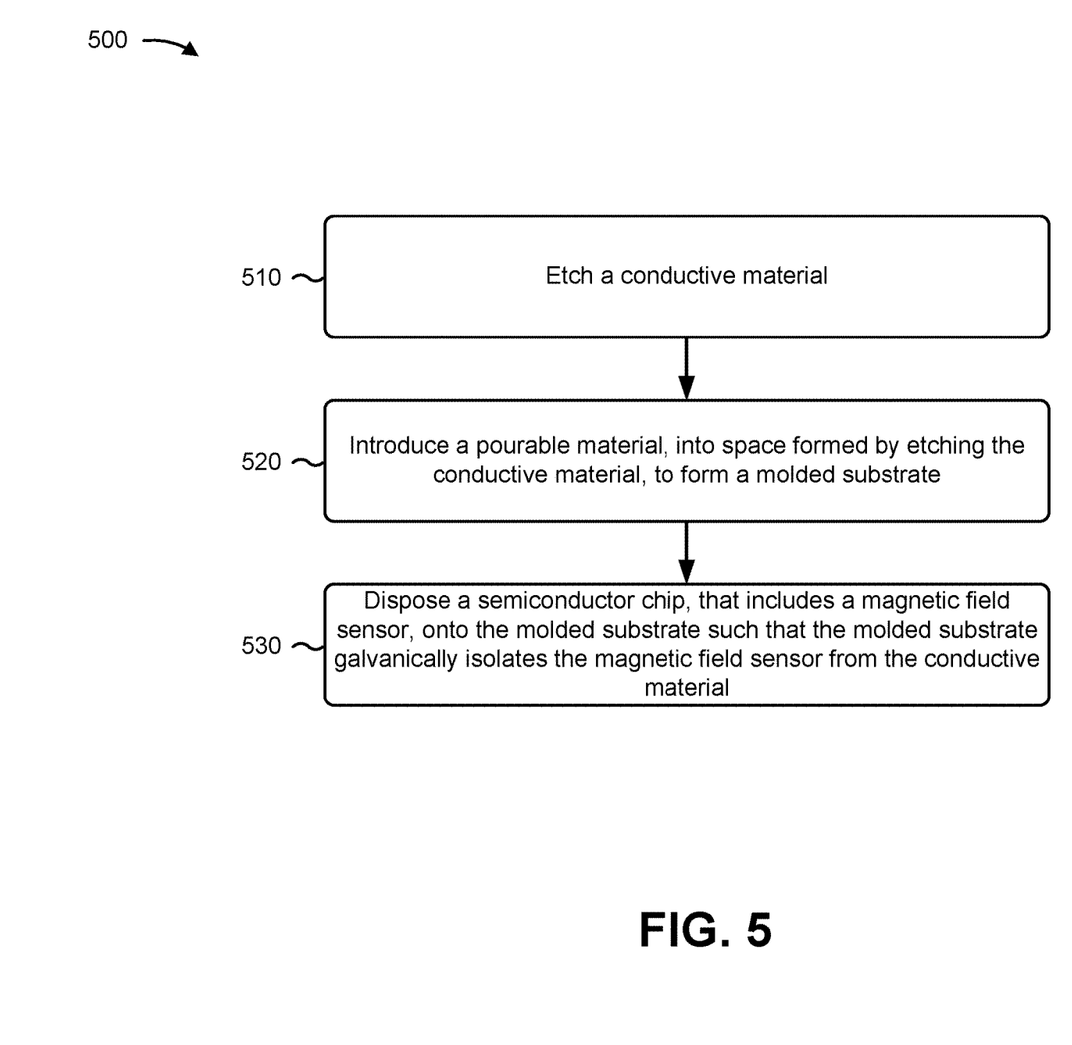
FIG. 5 is a flow chart of an example process for fabricating a current sensor device described herein.

FIG. 5 is a flow chart of an example process 500 for fabricating a current sensor.

As shown in FIG. 5, process 500 may include etching a conductive material (block 510), introducing a pourable material, into space formed by etching the conductive material, to form a molded substrate (block 520), and disposing a semiconductor chip, that includes a magnetic field sensor, onto the molded substrate such that the molded substrate galvanically isolates the magnetic field sensor from the conductive material (block 530), as described above.

In some implementations, process 500 may include additional aspects, such as one or more aspects described below and/or elsewhere herein.

For example, process 500 may include disposing a conductive clip onto the conductive material and/or introducing a pourable material to form a standoff region between the conductive clip and the semiconductor chip. The standoff region may galvanically isolate the conductive clip and the semiconductor chip.

In some implementations, the molded substrate galvanically isolates the conductive material from one or more leads configured to output a signal generated by the semiconductor chip. The conductive material may include, for example, an internal current rail internal to the semiconductor device; or a first connector for inputting current from an external current rail, external from the semiconductor device, and a second connector for outputting current to the external current rail.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A current sensor device, comprising:
    a routable molded lead frame comprising a molded substrate;
    a conductor;
    a semiconductor chip mounted to the molded substrate,
        wherein the semiconductor chip includes a magnetic field sensor that is galvanically isolated from the conductor by the molded substrate and is configured to sense a magnetic field created by current flowing through the conductor, and
        wherein the semiconductor chip is mounted directly onto a surface of the molded substrate;
    one or more leads configured to output a signal generated by the semiconductor chip,
        wherein the one or more leads are galvanically isolated from the conductor by the molded substrate; and
    a conductive clip electrically connected to the conductor and configured to carry the current from a first location to a second location that is closer to the semiconductor chip than the first location,
        wherein the conductive clip overlaps the semiconductor chip in a plan view,
        wherein a standoff region is between the conductive clip and the semiconductor chip, and
        wherein the standoff region galvanically isolates the conductive clip from the semiconductor chip.

2. The current sensor device of claim 1, wherein the molded substrate does not include a conductive material.

3. The current sensor device of claim 1, wherein the conductor comprises a current rail internal to the current sensor device.

4. The current sensor device of claim 1, wherein the conductor includes a first connector for inputting the current from a current rail, external from the current sensor device, and a second connector for outputting the current to the current rail.

5. The current sensor device of claim 1, wherein the current sensor device does not include an isolation platelet to galvanically isolate the conductive clip from the semiconductor chip.

6. The current sensor device of claim 1, wherein the conductive clip comprises a first portion, configured to carry the current directly from an input connector to an output connector, and a second portion configured to carry the current from the first location to the second location.

7. The current sensor device of claim 1, further comprising:
    an input connector;
    an output connector; and
    an internal connector that electrically connects the input connector and the output connector.

8. The current sensor device of claim 1, wherein the standoff region is composed of a molded layer.

9. The current sensor device of claim 1, wherein the conductive clip is further configured to carry the current from the second location to a third location that is farther from the semiconductor chip than the second location.

10. A semiconductor device package, comprising:
    a base plate comprised of a lead frame that includes a molded substrate;
    a conductor positioned adjacent to the molded substrate;
    a current sensor positioned on the molded substrate,
        wherein the molded substrate galvanically isolates the current sensor from the conductor, and
        wherein the current sensor is mounted directly onto a surface of the molded substrate;
    one or more leads adjacent to the molded substrate and configured to output a signal generated by the current sensor due to measurement of a magnetic field generated by current flowing through the conductor; and
    a conductive clip electrically connected to the conductor and configured to carry the current from a first location to a second location that is closer to the current sensor than the first location,
        wherein the conductive clip overlaps the current sensor in a plan view,
        wherein a standoff region is between the conductive clip and the current sensor, and
        wherein the standoff region galvanically isolates the conductive clip from the current sensor.

11. The semiconductor device package of claim 10, wherein the lead frame is a routable molded lead frame.

12. The semiconductor device package of claim 10, wherein the molded substrate galvanically isolates the one or more leads from the conductor.

13. The semiconductor device package of claim 10, wherein the conductor includes a current rail internal to the semiconductor device package.

14. The semiconductor device package of claim 10, wherein the conductor includes a first connector for inputting the current from a current rail, external from the semiconductor device package, and a second connector for outputting the current to the current rail.

15. The semiconductor device package of claim 10, wherein the standoff region is composed of a molded layer.

16. The semiconductor device package of claim 10, wherein the standoff region is formed from a pourable material.

17. A method for fabricating a semiconductor device, comprising:
    etching a conductive material;
    introducing a pourable material, into space formed by etching the conductive material, to form a molded substrate;
    mounting a semiconductor chip, that includes a magnetic field sensor, directly onto a surface of the molded substrate such that the molded substrate galvanically isolates the magnetic field sensor from the conductive material; and
    disposing a conductive clip onto the conductive material, wherein the conductive clip is configured to carry current, flowing through the conductive material, from a first location to a second location that is closer to the semiconductor chip than the first location, wherein the conductive clip overlaps the semiconductor chip in a plan view, wherein a standoff region is between the conductive clip and the semiconductor chip, and wherein the standoff region galvanically isolates the conductive clip from the semiconductor chip.

18. The method of claim 17, further comprising:
introducing another pourable material to form the standoff region between the conductive clip and the semiconductor chip.

19. The method of claim 17, wherein the molded substrate galvanically isolates the conductive material from one or more leads configured to output a signal generated by the semiconductor chip.

20. The method of claim 17, wherein the conductive material comprises:
an internal current rail internal to the semiconductor device, or
a first connector for inputting the current from an external current rail, external from the semiconductor device, and a second connector for outputting the current to the external current rail.

* * * * *